United States Patent
Ting et al.

(10) Patent No.: US 9,991,368 B2
(45) Date of Patent: *Jun. 5, 2018

(54) VERTICAL BJT FOR HIGH DENSITY MEMORY

(71) Applicant: Taiwan Semiconductor Manufacturing Co., Ltd., Hsin-Chu (TW)

(72) Inventors: Yu-Wei Ting, Taipei (TW); Chun-Yang Tsai, Hsinchu (TW); Kuo-Ching Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/371,801

(22) Filed: Dec. 7, 2016

(65) Prior Publication Data

US 2017/0092748 A1    Mar. 30, 2017

Related U.S. Application Data

(60) Continuation of application No. 14/826,318, filed on Aug. 14, 2015, now Pat. No. 9,543,404, which is a
(Continued)

(51) Int. Cl.
*H01L 27/00* (2006.01)
*H01L 29/732* (2006.01)
(Continued)

(52) U.S. Cl.
CPC .......... *H01L 29/732* (2013.01); *G11C 11/161* (2013.01); *G11C 13/003* (2013.01);
(Continued)

(58) Field of Classification Search
CPC ..................................................... H01L 27/00
(Continued)

(56) References Cited

U.S. PATENT DOCUMENTS

| 4,958,320 A | 9/1990 | Homma et al. |
| 5,346,836 A | 9/1994 | Manning et al. |

(Continued)

FOREIGN PATENT DOCUMENTS

| KR | 20010017881 A | 3/2001 |
| TW | 439268 | 6/2001 |

(Continued)

OTHER PUBLICATIONS

Ching-Hua Wang, et al. "Three-Dimensional 4F2 ReRAM Cell with CMOS Logic Compatible Process." Electron Devices Meeting (IEDM), 2010 IEEE International , vol., No., pp. 29.6.1-29.6.4, Dec. 6-8, 2010. 4 Pages.
(Continued)

*Primary Examiner* — Min Huang
(74) *Attorney, Agent, or Firm* — Eschweiler & Potashnik, LLC

(57) ABSTRACT

Some aspects of this disclosure relate to a memory device. The memory device includes a collector region having a first conductivity type and which is coupled to a source line of the memory device. A base region is formed over the collector region and has a second conductivity type. A gate structure is coupled to the base region and acts as a shared word line for first and second neighboring memory cells of the memory device. First and second emitter regions are formed over the base region and have the first conductivity type. The first and second emitter regions are arranged on opposite sides of the gate structure. First and second contacts extend upwardly from the first and second emitter regions, respectively, and couple the first and second emitter regions
(Continued)

to first and second data storage elements, respectively, of the first and second neighboring memory cells, respectively.

20 Claims, 6 Drawing Sheets

Related U.S. Application Data division of application No. 13/723,762, filed on Dec. 21, 2012, now Pat. No. 9,153,672.

(51) Int. Cl.
*H01L 29/66* (2006.01)
*H01L 27/22* (2006.01)
*H01L 27/24* (2006.01)
*G11C 11/16* (2006.01)
*G11C 13/00* (2006.01)

(52) U.S. Cl.
CPC ........ H01L 27/226 (2013.01); H01L 27/2445 (2013.01); H01L 29/66272 (2013.01); *G11C 2213/79* (2013.01)

(58) Field of Classification Search
USPC .......................................................... 365/148
See application file for complete search history.

(56) References Cited

U.S. PATENT DOCUMENTS

| | | | |
|---|---|---|---|
| 5,346,863 A | 9/1994 | Hikata et al. | |
| 5,801,420 A | 9/1998 | Fujishima | |
| 5,998,820 A | 12/1999 | Chi | |
| 6,392,273 B1 | 5/2002 | Chang | |
| 9,153,672 B2 * | 10/2015 | Ting | H01L 29/66272 |
| 2003/0007382 A1 | 1/2003 | Bohm et al. | |
| 2008/0067584 A1 | 3/2008 | Lui et al. | |
| 2008/0099852 A1 | 5/2008 | Faul | |
| 2009/0237984 A1 * | 9/2009 | Porter | G11C 13/0004 365/163 |
| 2010/0226165 A1 | 9/2010 | Kang et al. | |
| 2011/0140169 A1 | 6/2011 | Briere | |
| 2011/0248233 A1 | 10/2011 | Pellizzer et al. | |
| 2011/0248266 A1 * | 10/2011 | Miyake | H01L 29/7869 257/57 |
| 2012/0025288 A1 | 2/2012 | Doris et al. | |
| 2012/0049934 A1 | 3/2012 | Shih | |
| 2012/0217463 A1 | 8/2012 | Hwang | |
| 2013/0076393 A1 | 3/2013 | Stephani et al. | |
| 2013/0270501 A1 * | 10/2013 | Toh | H01L 45/04 257/2 |

FOREIGN PATENT DOCUMENTS

| | | |
|---|---|---|
| TW | 200616209 | 5/2006 |
| TW | I280656 | 5/2007 |

OTHER PUBLICATIONS

Notice of Allowance dated Jun. 18, 2014 Korean Patent Application No. 1020130023880.
Non-Final Office Action dated Aug. 27, 2014 for U.S. Appl. No. 13/723,762.
Final Office Action dated Dec. 16, 2014 for U.S. Appl. No. 13/723,762.
Notice of Allowance dated Apr. 3, 2015 for U.S. Appl. No. 13/723,762.
Non-Final Office Action dated Jun. 1, 2016 for U.S. Appl. No. 14/826,318.
Notice of Allowance dated Aug. 30, 2016 for U.S. Appl. No. 14/826,318.

* cited by examiner

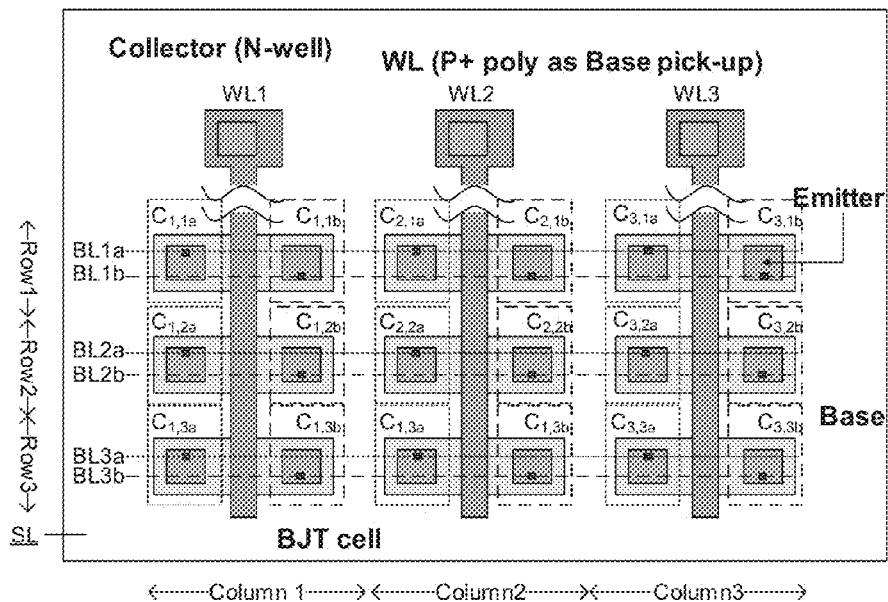
FIG. 1
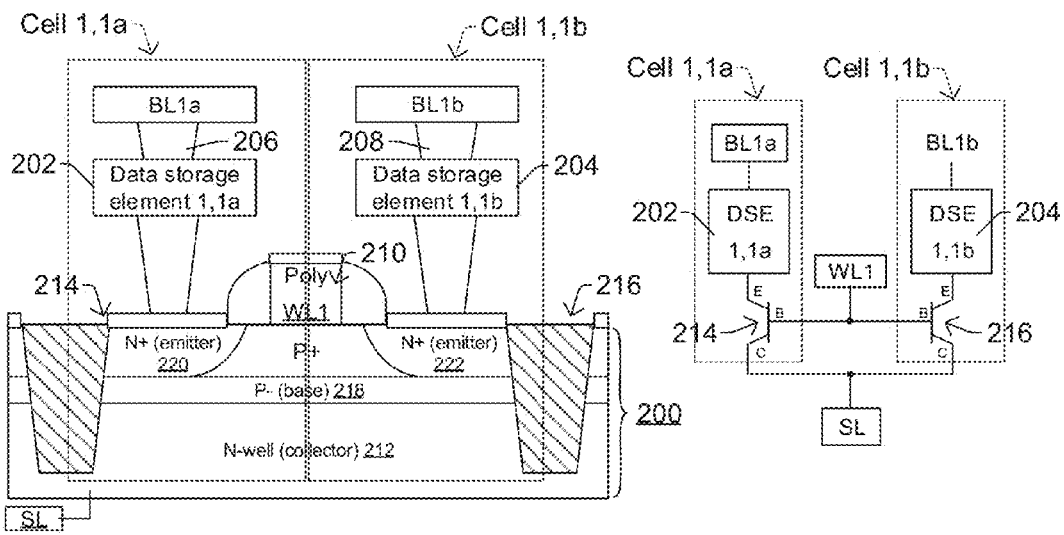
FIG. 2A  Fig. 2B

VERTICAL BJT FOR HIGH DENSITY MEMORY

REFERENCE TO RELATED APPLICATION

This Application is a Continuation of U.S. patent application Ser. No. 14/826,318 filed on Aug. 14, 2015, which is a Divisional of U.S. application Ser. No. 13/723,762 filed on Dec. 21, 2012 (now U.S. Pat. No. 9,153,672 issued on Oct. 6, 2015), the contents of which are incorporated by reference in their entirety.

BACKGROUND

Computer memory is a technology consisting of semiconductor devices arranged to retain digital data. It is a fundamental component of computers. Resistive random access memory (RRAM) and magnetic random access memory (MRAM) are two types of memory garnering attention.

In RRAM, the basic idea is that a resistance of a dielectric can be changed to store different states depending on the voltage applied to it. To form an array, a number of memory elements can be arranged in a configuration where parallel bit lines are crossed by perpendicular word lines with the variable resistance dielectric placed between word line and bit line at every cross-point. This configuration is called a cross-point cell. Unfortunately, since this architecture can lead to a large "sneak" parasitic current flowing through non selected memory cells via neighboring cells, the cross-point array has a very slow read access. An access element can be added to improve the situation, but conventional access elements consume significant area on the chip. The present disclosure relates to vertical bipolar junction transistors (BJTs) that can be used as access elements to reduce the area of individual memory cells, thereby increasing the density of the memory array.

BRIEF DESCRIPTION OF THE DRAWINGS

FIG. 1 shows a top view of some embodiments of a portion of a memory device.

FIG. 2A shows a cross-sectional view of some embodiments of first and second neighboring memory cells consistent with FIG. 1's embodiments.

FIG. 2B is a schematic representation of some embodiments of first and second neighboring memory cells consistent with FIG. 2A's embodiments.

DETAILED DESCRIPTION

Figure 3:
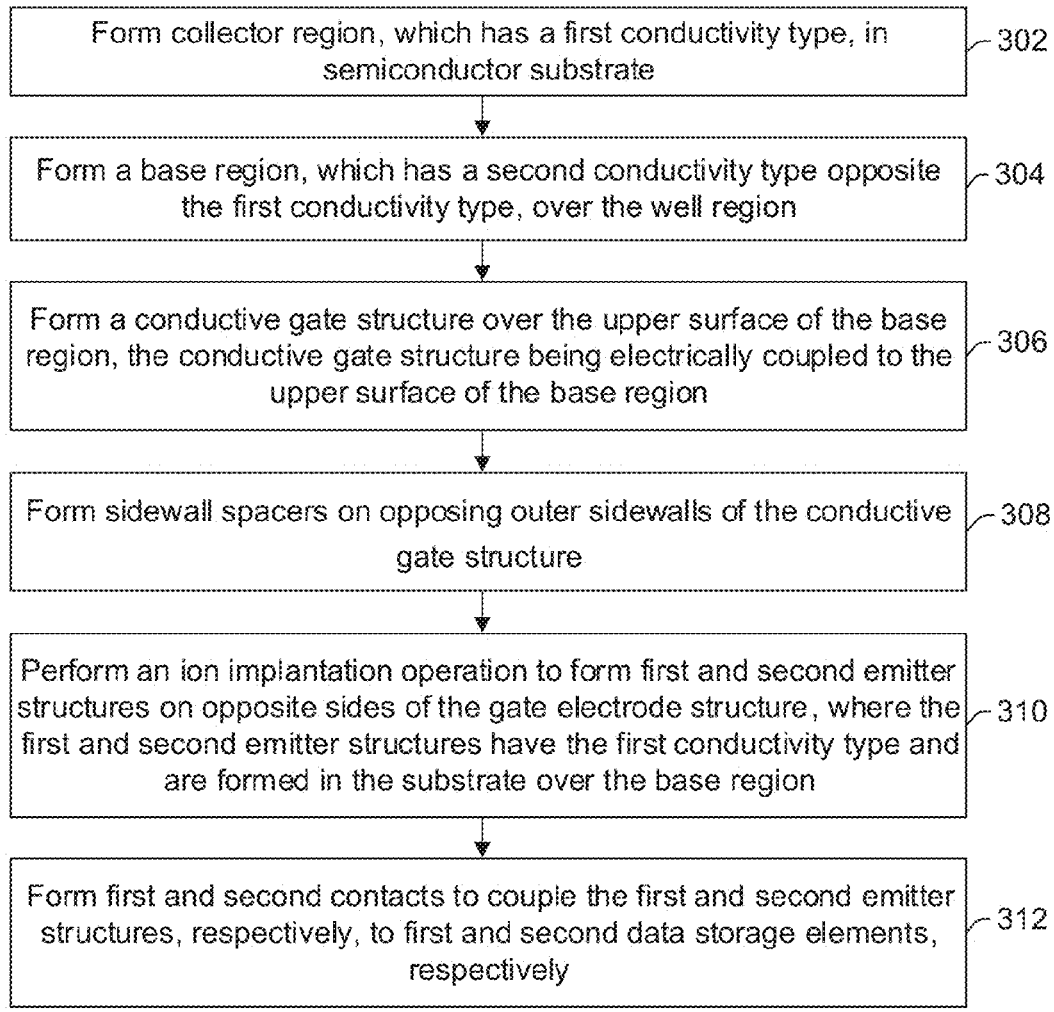
FIG. 3 shows a flow chart illustrating some embodiments of a method for manufacturing a memory device.
Figure 4:
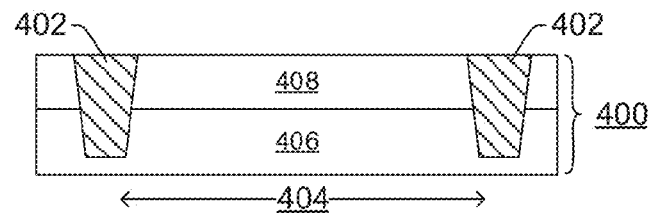
FIGS. 4-13 are a series of cross-sectional views collecting depicting some embodiments of a method for manufacturing a memory device.

The present disclosure will now be described with reference to the attached drawing figures, wherein like reference numerals are used to refer to like elements throughout, and wherein the illustrated structures and devices are not necessarily drawn to scale.

Aspects of the present disclosure relate to memory device, such as magnetic random access memory (MRAM) or resistive random access memory (RRAM) which utilize a vertical BJT access transistor. The use of the BJT access transistor facilitates denser memory storage than previously achievable, and also promotes reduced current leakage relative to some implementations.

FIG. 1 shows a top view of a memory device 100 in accordance with some embodiments that includes a number of memory cells arranged in a series of columns and rows. For purposes of illustration, FIG. 1's memory cells are arranged in three rows and three columns wherein the individual cells are labeled $C_{row\text{-}column}$, although typical embodiments will include thousands, millions or other numbers of rows and columns that collectively establish a memory array to store digital data. Word lines are coupled to neighboring cells along respective columns (e.g., word line WL1 is coupled to neighboring cells $C_{1,1a}$ and $C_{1,1b}$; $C_{1,2a}$ and $C_{1,2b}$, $C_{1,3a}$ and $C_{1,3b}$ along column 1), and a pair of bit lines (e.g., BL1a and BL1b) are coupled to cells ($C_{1,1a}$ and $C_{1,1b}$; $C_{2,1a}$ and $C_{2,1b}$, $C_{3,1a}$ and $C_{3,1b}$, ) along respective rows (e.g., Row1). Often, the bit lines are implemented in parallel metal lines (e.g., metal 1 or metal 2 lines), which are closely spaced.

FIG. 2A is a cross-sectional view of first and second neighboring memory cells (i.e., $C_{1,1a}$ and $C_{1,1b}$) formed on a semiconductor substrate 200 and which include first and second data storage elements 202, 204, respectively, to store data states for the respective cells $C_{1,1a}$, $C_{1,1b}$. The data storage elements 202, 204 can be resistive data storage elements or magnetic data storage elements, for example. First and second bit lines (BL1a, BL1b), which are formed in an upper level interconnect layer, are coupled to upper portions of the first and second data storage elements 202, 204, respectively, through respective contacts/vias 206, 208. A gate structure 210, which acts as a shared word line (WL1) for the first and second data storage elements 202, 204, straddles a boundary between the first and second memory cells $C_{1,1a}$, $C_{1,1b}$.

Notably, the first and second memory cells $C_{1,1a}$, $C_{1,1b}$ include respective vertical BJTs 214, 216 that are configured to selectively couple a source line to the first and second data storage elements 202, 204, respectively, based on a word line voltage applied to the word line WL1. Because the vertical BJTs 214, 216 are compact from an area standpoint, these vertical BJTs 214, 216 help to provide a dense layout for the memory array. In addition, the vertical BJTs 214, 216 provide good protection against current leakage. FIG. 2B shows an equivalent circuit schematic for FIG. 2A's cross-section.

As shown in FIG. 2A, to implement these vertical BJTs, a collector region in the form of a deep well region 212 is formed in the semiconductor substrate 200. The collector region 212 has a first conductivity type (e.g., n−) and is coupled to a source line SL of the memory device. A base region 218 is formed in the semiconductor substrate over the collector region 212 and has a second conductivity type (e.g., p−). The gate structure 210 is coupled to the base region 218 and, as previously mentioned, acts as a shared word line for first and second neighboring memory cells. First and second emitter regions 220, 222 are formed in the substrate 200 over the base region 218. The first and second emitter regions 220, 222 have the first conductivity type, and are arranged on opposite sides of the gate structure 210.

During operation, control circuitry biases the word lines, bit lines, and source lines of the memory array according to pre-determined bias conditions to read and write individual data states to the individual cells. In some embodiments, each individual cell stores a binary logic state (e.g., a logical "1" or a logical "0"), but in other embodiments each individual cell can each store a multilevel data state. In such a multilevel configuration, each cell can store a state representing more than two logic states—for example, four or eight logic states. Although multi-level data states may require greater precision when writing data to and/or reading data from the individual cells, they can tend to promote higher density data storage in the array compared to binary storage.

Table 1 below illustrates an example biasing scheme that can be used to write binary data states (e.g., "1" and "0" data states) to the memory device of FIGS. 1 and 2A-2B.

TABLE 1

Applied biases for binary write operations

| | Write "1" | | Write "0" | |
| --- | --- | --- | --- | --- |
| Operation | Selected cell | Non-selected cell | Selected Cell | Non-selected cell |
| WL | High | Floating | High | Floating |
| BL | High | Floating | Low | Floating |
| SL | Low | Low | High | High |

For example, to write to the cells of column 1 in FIG. 1, WL1 is driven high and WL2-WL3 are left floating. This places the vertical BJTs for the cells of column 1 into conductive states, i.e., accesses the cells of column 1, and couples the sourceline SL to the data storage elements for the accessed cells. Other un-accessed cells (e.g., columns 2-3) have the sourceline decoupled from their data storage elements. To write a "1" value to an accessed cell of column 1, the cell's bit line is driven high, while the sourceline is driven low. After this bias condition is applied for a sufficient duration of time, the word line, bit line, and source lines can be de-asserted and the "1" value will remain programmed in the accessed cell. After the "1" values are written, the "0" values can be written to desired cells by driving the sourceline high and concurrently driving the corresponding bit lines low while the word line is asserted. Again, after this bias is applied for a sufficient duration of time, the word line, bit lines, and sourceline can be de-asserted and the "0" value will remain programmed in the accessed cells.

Table 2 below illustrates an example biasing scheme that can be used to read data from the memory device of FIGS. 1 and 2A-2B.

TABLE 2

Applied biases for read operations

| | Read | |
| --- | --- | --- |
| Operation | Selected cell | Non-selected cell |
| WL | High | Floating |
| BL | Low | Floating |
| SL | Medium | High |

FIG. 3 shows some embodiments of a method of manufacturing a memory device. The method is illustrated and now described as a series of acts or blocks. It will be appreciated that some of the acts or blocks may be further subdivided into multiple acts or blocks in some implementations, or may multiple illustrated acts or blocks can be combined in other implementations. Additional un-illustrated acts or blocks may also be present, and/or illustrated acts or blocks may be omitted in some implementations. Also, the order of the acts or blocks may be re-ordered in some embodiments. All such changes are contemplated as falling within the scope of the present disclosure.

FIG. 3's method 300 starts at 302 when a collector region, which has a first conductivity type, is formed in semiconductor substrate. In 304, a base region, which has a second conductivity type opposite the first conductivity type, is formed over the well region. In 306, a conductive gate structure, which acts as a word line, is formed over the base region and electrically coupled thereto. In 308, sidewall spacers are formed on opposing outer sidewalls of the conductive gate structure. In 310, an ion implantation operation is performed to form first and second emitter structures on opposite sides of the gate electrode structure. The first and second emitter structures, which are self-aligned with the gate structure and sidewall spacers when formed in this manner, have the first conductivity type and are formed in the substrate over the base region. In 312, first and second contacts are formed to couple the first and second emitter structures, respectively, to first and second data storage elements, respectively.

FIGS. 4-13 show a more detailed method for manufacturing a memory device in accordance with some embodiments. The more detailed method begins in FIG. 4, where a semiconductor substrate 400 is provided. The semiconductor substrate 400 includes isolation structures 402, such as shallow trench isolation (STI) structures in which dielectric regions are formed in trenches that laterally surround an active area 404 of the substrate. A deep well region 406 having a first conductivity type (e.g., n-well), which can constitute a collector region, is formed in the substrate. A shallow well region 408 having a second conductivity type (e.g., p-well), which can constitute a base region, is formed over the deep well region 406.

The substrate 400 can be a bulk semiconductor wafer, such as a silicon wafer, a binary compound substrate (e.g., GaAs wafer), a ternary compound substrate (e.g., AlGaAs), or higher order compound wafers, among others. Further, the semiconductor substrate 400 can also include non semi-conductor materials such as oxide in silicon-on-insulator (SOI), partial SOI substrate, polysilicon, amorphous silicon, or organic materials, among others. In some embodiments, the semiconductor substrate 400 can include multiple wafers or dies which are stacked or otherwise adhered together. The semiconductor substrate 400 can include wafers which are cut from a silicon ingot, and/or any other type of semiconductor/non-semiconductor and/or deposited or grown (e.g. epitaxial) layers formed on an underlying substrate.

Figure 5:
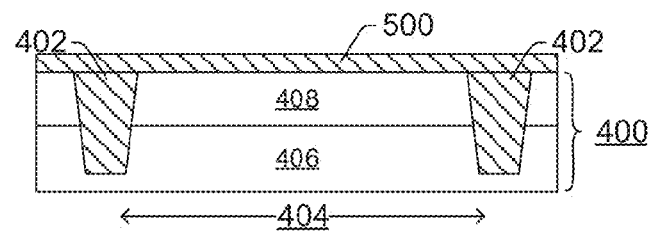
Figure 6:
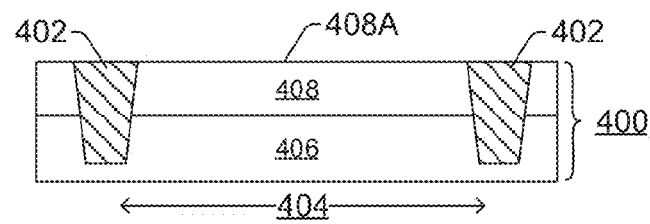

In FIG. 5, a gate dielectric 500 is formed over the base region 408. Although the gate dielectric 500 is removed from over the base region 408 within the memory array (see FIG. 6 wherein an upper surface 408a of the base region 408 is exposed after gate dielectric 500 has been removed), the gate dielectric 500 is often left in place over other portions of the memory device and/or other portions of the integrated circuit where MOS type transistors are formed.

Figure 7:
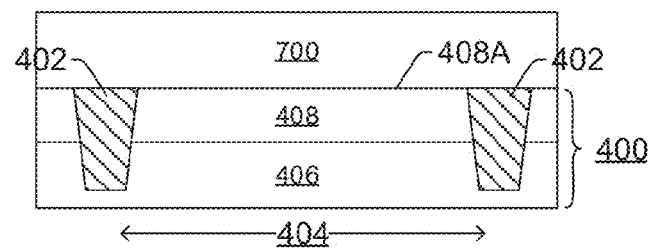

In FIG. 7, a conductive gate layer 700 is formed over the base region 408 directly on the upper surface 408A. The conductive gate layer 700 is often polysilicon, although it could also be metal or another conductive material.

Figure 8:
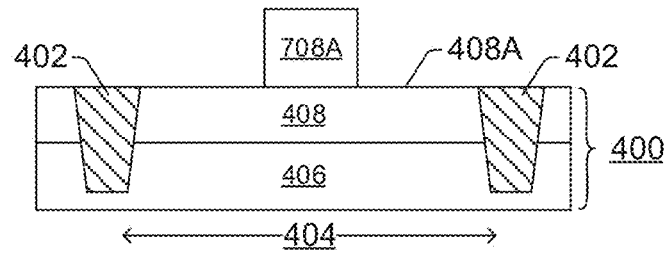

In FIG. 8, the conductive gate layer 700 is patterned to form a conductive gate electrode 708A. Because the gate oxide has been completely or at least partially removed, the conductive gate electrode 708A is electrically coupled to the base region 408.

Figure 9:
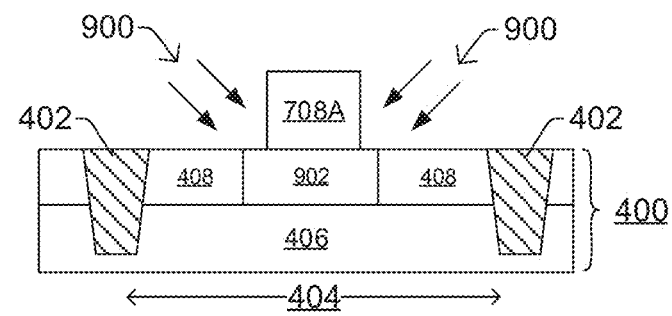

In FIG. 9, an angled implant 900 is performed to form a highly doped, pocket implant region 902 under the gate electrode 708A. The angled implant 900 has the second conductivity type (e.g., p+), and is implanted such that the pocket implant region 902 usually has a higher dopant concentration than the base regions 408.

Figure 10:
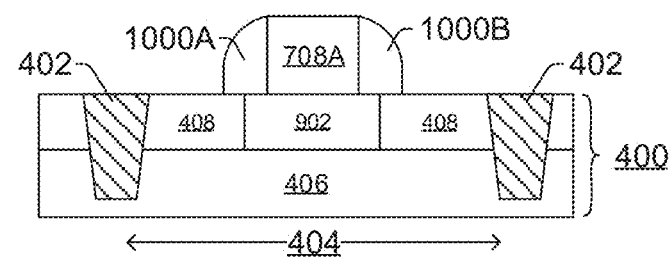

In FIG. 10, sidewall spacers 1000A, 1000B are formed on opposite sides of the conductive gate electrode 708A. The sidewall spacers include a dielectric material, such as nitride or oxide, however, other materials can also be used.

Figure 11:
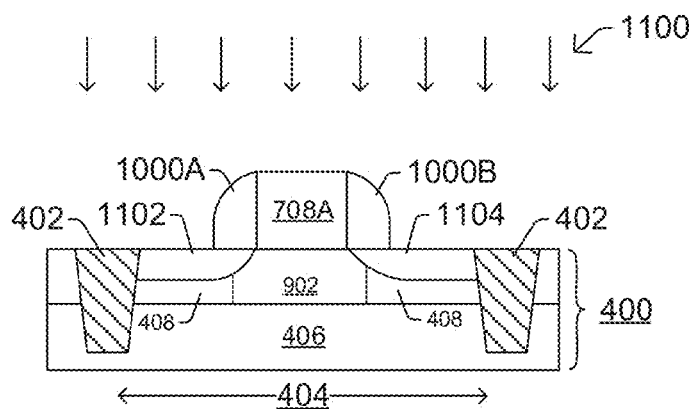

In FIG. 11, an emitter implant 1100 is carried out. The emitter implant has the first conductivity type (e.g., n+), and is implanted to provide a high doping concentration for first and second emitter regions 1102, 1104. Because the emitter implant is carried out with the conductive gate electrode 708A and spacers 1000A, 100B in place, the first and second emitter regions 1102, 1104 are said to be self-aligned with respect to the conductive gate structure and spacers.

Figure 12:
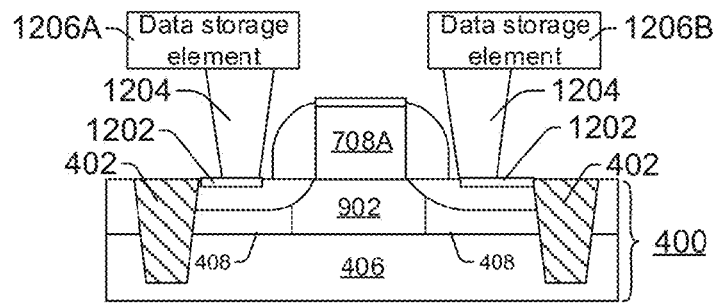

In FIG. 12, silicide regions 1202 are formed near upper surfaces of the first and second emitter regions 1102, 1104, as well as on an upper surface of the conductive gate electrode 708A, and contacts 1204 which are ohmically coupled to the emitter regions via the silicides are formed thereafter. After the contacts 12024 have been formed, first and second data storage elements 1206A, 1206B are formed over the substrate. In some implementations, the data storage elements 1206A, 1206B are magnetic memory storage elements, wherein magnetization of a magnetic memory storage element represents a data state stored in the cell. In other implementations, the data storage elements 1206A, 1206B are resistive memory storage elements, wherein a resistance of the resistive memory storage element represents a data state stored in the cell.

Figure 13:
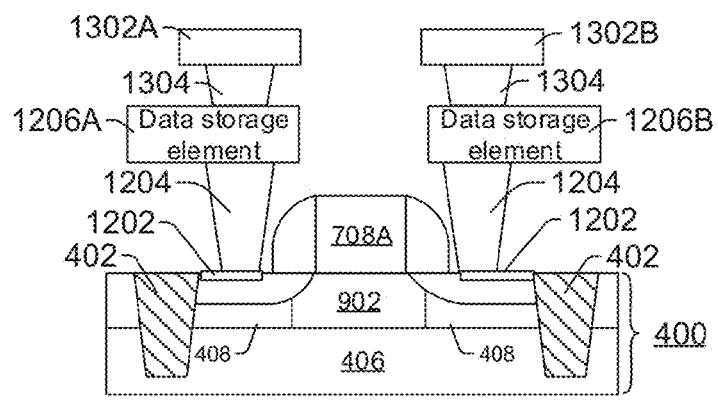

In FIG. 13, first and second bit lines 1302A, 1302B are formed over the data storage elements 1206A, 1206B, respectively, and are coupled to upper regions of the data storage elements through contacts/vias 1304.

Figure 14:
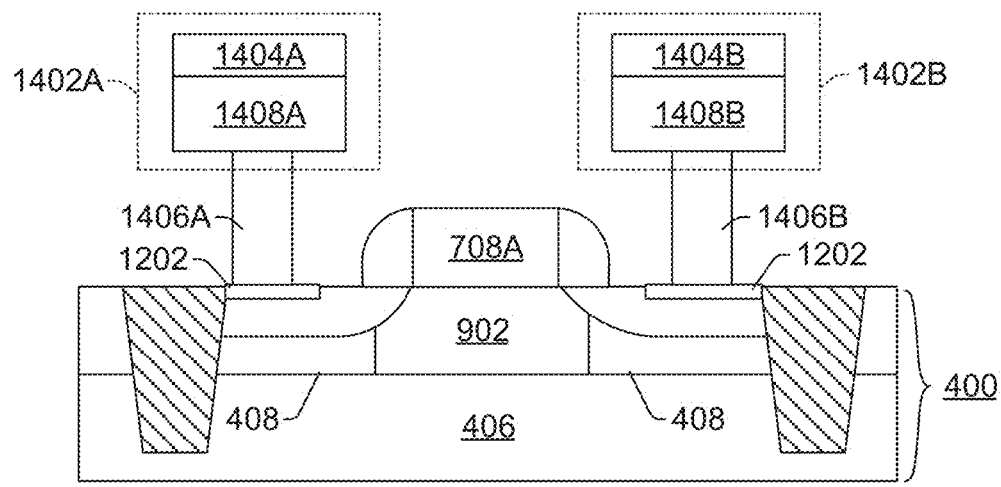
FIG. 14 shows a cross-sectional view of some embodiments of first and second neighboring RRAM cells.

FIG. 14 shows an example cross-section of an RRAM device 1400 that includes data storage elements 1402A, 1402B, wherein the data storage elements are associated with neighboring RRAM cells. Each data storage element 1402A, 1402B includes upper and lower electrodes (e.g., 1404A, 1406A) with a variable resistance region (e.g., 1408A) arranged there between, wherein the variable resistance region changes its resistive state based on a current or voltage applied thereto through the upper and lower electrodes. The variable resistance region may be reset (e.g., broken or made into an amorphous silicon region, resulting in high resistance) or set (re-formed or made into a polycrystalline silicon region, resulting in lower resistance) by an appropriately applied voltage or current. A large number of inorganic and organic material systems showing thermal or ionic resistive variable resistance effects can be used for the variable resistance region 1408, including but not limited to: phase change chalcogenides like $Ge_2Sb_2Te_5$ or AgInSbTe; binary transition metal oxides like NiO or $TiO_2$, perovskites like $Sr(Zr)TiO_3$ or PCMO; solid-state electrolytes like GeS, GeSe, or $Cu_2S$; organic charge transfer complexes like CuTCNQ; organic donor-acceptor systems like Al AIDCN; and/or various molecular systems.

The disclosed concepts are also applicable to MRAM devices. In an MRAM cell, the data storage element for each MRAM cell includes an upper ferromagnetic plate and a lower ferromagnetic plate, which are separated by a thin insulating layer also referred to as a tunnel barrier layer. One of the two ferromagnetic plates, for example the lower plate, is a magnet that is pinned to an antiferromagnetic layer. The other ferromagnetic plate, for example the upper plate, is a free magnetic layer that can have its magnetic field changed to one of two or more values to store one of two or more corresponding data states. Each data storage element can be written to by controlling the amount of current passed through the data storage element, wherein the current passed through the data storage element induces a change in the magnetic field of the magnetic free layer. Due to the magnetic tunnel effect, the electrical resistance of the data storage element changes in accordance with the magnetic fields stored on the two plates for the cell. Hence, by measuring the electrical resistance of the data storage element for the cell, read circuitry on the memory device can discern between "0" and "1" data states (and/or multi-bit digital values) stored in the data storage element.

Although some embodiments have been described above where a first conductivity type is n-type and a second conductivity type is p-type, it will be appreciated that in other embodiments the first conductivity type can be p-type and the second conductivity type can be n-type. Thus, the polarity of the BJTs can be "flipped" along with a corresponding change in biasing applied. Also, although some embodiments may be described and illustrated with regards to "rows" and "columns" it will be appreciated that rows and columns can be exchanged with one another in various implementations and are not necessary perfectly orthogonal to one another.

Thus, it will be appreciated that some aspects of the present disclosure relate to a memory device. The memory device includes a collector region formed in a semiconductor substrate. The collector region has a first conductivity type and is coupled to a source line of the memory device. A base region is formed in the semiconductor substrate over the collector region and has a second conductivity type. A gate structure is coupled to the base region and acts as a shared word line for first and second neighboring memory cells of the memory device. First and second emitter regions are formed in the substrate over the base region and have the first conductivity type. The first and second emitter regions arranged on opposite sides of the gate structure. First and second contacts extend upwardly from the first and second emitter regions, respectively, and couple the first and second emitter regions to first and second data storage elements, respectively, of the first and second neighboring memory cells, respectively.

Other embodiments relate to a memory device. The memory device includes an array of memory cell pairs arranged in rows and columns, wherein respective memory cells in a memory cell pair include respective data storage elements arranged to store respective data states. A word line extends in a first direction between memory cells of neighboring memory cell pairs along a column. The word line is coupled to individual memory cells of the memory cell pairs along the word line. Bit lines extend in a second direction that is substantially perpendicular to the first direction and are coupled to data storage elements. A vertical bipolar junction transistor (BJT) is configured to selectively couple a source line to a data storage element based on a word line voltage.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. Further, although the terms "first", "second" "third"

and the like are used in this specification, it will be appreciated that such terms are merely generic identifiers and do not imply any spatial or temporal relationship between the various features. Also, although terms such as "upper", "lower", "above", and "below" are used herein, it is to be appreciated that no absolute reference frame (e.g., the ground beneath one's feet) is implied with respect to these and other similar terms. Rather, any coordinate frame can be selected for such terms. In addition, while a particular aspect may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device, comprising:
    an array of memory cell pairs arranged in rows and columns over a semiconductor substrate, wherein each memory cell pair comprises: a first data storage element configured to be selectively accessed by a first vertical bipolar junction transistor (BJT), a second data storage element configured to be selectively accessed by a second vertical BJT, and a shared base region that is common to the first and second vertical BJTs of the memory cell pair;
    a word line extending in a first direction directly over an upper surface of the semiconductor substrate so the first data storage elements of a column of the array are arranged to a first side of the word line and so the second data storage elements of the column are arranged on a second side of the word line, the second side being opposite the first side, wherein the word line is coupled to the shared base region of each memory cell pair of the column; and
    a pair of dielectric sidewall spacers directly contacting opposite sidewalls of the word line, the pair of dielectric sidewall spacers having lower surfaces in direct contact with an upper surface of the semiconductor substrate, wherein the pair of dielectric sidewall spacers have tapered upper surfaces so lowermost portions of the pair of dielectric sidewall spacers have a first width and uppermost portions of the dielectric sidewalls spacers have a second width less than the first width.

2. The memory device of claim 1, wherein a first memory cell pair and a second memory cell pair are arranged on different rows within the column, the first memory cell pair including a first shared base region and the second memory cell pair including a second shared base region which is spaced apart from the first shared base region in the first direction.

3. The memory device of claim 2, wherein the shared base region has a first conductivity type, and wherein the first and second vertical BJTs of the first memory cell pair comprise:
    first and second emitter regions corresponding to the first and second vertical BJTs of the first memory cell pair, respectively, and being disposed in the semiconductor substrate over the first shared base region and on opposite sides of the word line, the first shared base region having a second conductivity type opposite the first conductivity type;
    wherein the first and second data storage elements include first and second variable resistance dielectric regions, respectively, which are coupled to the first and second emitter regions, respectively, through first and second pillar-shaped contacts, respectively.

4. The memory device of claim 3, wherein the first and second vertical BJTs of the second memory cell pair comprise:
    third and fourth emitter regions corresponding to the first and second vertical BJTs of the second memory cell pair, respectively, and being disposed in the semiconductor substrate over the second shared base region and having the second conductivity type, the third and fourth emitter regions arranged on opposite sides of the word line and spaced apart from the first and second emitter regions.

5. The memory device of claim 1, wherein the first data storage element and the second data storage element of a memory cell pair are configured to store complementary data states.

6. The memory device of claim 1, wherein the first data storage element and the second data storage element have lowermost surfaces located at a first height, as measured from an upper surface of the semiconductor substrate, and tops of the tapered upper surfaces of the dielectric sidewall spacers reside at a second height as measured from the upper surface of the semiconductor substrate, the first height being greater than the second height.

7. The memory device of claim 1, further comprising:
    first and second bit lines extending in a second direction that is substantially perpendicular to the first direction, the first bit line being coupled to the first data storage element of a memory cell pair, and the second bit line being coupled to a second data storage element of the memory cell pair.

8. The memory device of claim 7, wherein the first and second bit lines are coupled to upper surface regions of the first and second data storage elements, respectively, for the memory cell pair, and wherein lower surface regions of the first and second data storage elements are coupled to uppermost regions of the first and second vertical BJTs for the memory cell pair.

9. The memory device of claim 8, further comprising:
    a contact or via extending upwardly from an uppermost region of the first or second vertical BJT to a lower surface region of the first or second data storage element.

10. A memory device, comprising:
    a collector region disposed in a semiconductor substrate, the collector region having a first conductivity type and coupled to a source line of the memory device;
    first and second base regions disposed in the semiconductor substrate and spaced apart over the collector region and having a second conductivity type, the first base region corresponding to a first pair of memory cells and the second base region corresponding to a second pair of memory cells;
    a gate structure which directly contacts an upper surface of the semiconductor substrate and which extends continuously between the first and second base regions and which acts as a shared word line for the first and second pairs of memory cells of the memory device; and
    first and second dielectric sidewall spacers on opposite sidewalls of the gate structure, the first and second dielectric sidewall spacers having interior sidewalls in direct contact with outer sidewalls of the gate structure.

11. The memory device of claim 10, further comprising:
first and second emitter regions disposed in the substrate over the first base region, the first and second emitter regions arranged on opposite sides of the gate structure and corresponding to first and second memory cells that make up the first pair of memory cells.

12. The memory device of claim 11, further comprising:
first and second contacts extending upwardly from upper regions of the first and second emitter regions, respectively, and coupling the first and second emitter regions to lower regions of first and second data storage elements, respectively, of the first and second memory cells, respectively.

13. The memory device of claim 10, further comprising:
first and second emitter regions disposed in the substrate over the first and second base regions, respectively, the first and second emitter regions arranged on one side of the gate structure.

14. The memory device of claim 13, further comprising:
first and second contacts extending upwardly from upper regions of the first and second emitter regions, respectively, and coupling the first and second emitter regions to lower regions of first and second data storage elements, respectively, of the first and second memory cells, respectively.

15. The memory device of claim 10, wherein the first pair of memory cells and the second pair of memory cells each includes two memory cells that are configured to store complementary data states.

16. A memory device, comprising:
an array of memory cell pairs arranged in rows and columns in or on a semiconductor substrate, wherein respective memory cells in a memory cell pair include respective magnetic or resistive data storage elements arranged to store respective data states;
a word line extending in a first direction between memory cells of neighboring memory cell pairs along a column, wherein the word line directly contacts an upper surface of the semiconductor substrate and extends continuously between memory cells of multiple memory cell pairs along the word line;
a pair of insulating sidewall spacers on opposite sidewalls of the word line, the pair of insulating sidewall spacers having lower surfaces in direct contact with an upper surface of the semiconductor substrate and having interior sidewalls in direct contact with outer sidewalls of the word line;
a pair of complementary bit lines coupled to respective magnetic or resistive data storage elements along a row, the pair of complementary bit lines extending in a second direction that is substantially perpendicular to the first direction; and
a vertical bipolar junction transistor (BJT), including a base that vertically separates an emitter and a collector, wherein the emitter or collector is located at an uppermost region of the vertical BJT and is coupled to a lower surface region of a magnetic or resistive data storage element through a contact or via.

17. The memory device of claim 16, further comprising sidewall spacers on opposite sidewalls of the word line.

18. The memory device of claim 17, wherein the sidewall spacers are in direct contact with the upper surface of the semiconductor substrate.

19. The memory device of claim 16, wherein the base is electrically coupled to the word line by a doped region having a conductivity type that is opposite that of the emitter.

20. The memory device of claim 19, wherein the collector and emitter of the vertical BJT are selectively coupled based on how a voltage-level or current-level applied to the base relates to a predetermined threshold level.

\* \* \* \* \*